(12) United States Patent
Ito et al.

(10) Patent No.: US 11,281,097 B2
(45) Date of Patent: Mar. 22, 2022

(54) METHOD FOR FORMING PATTERN BY USING PHOTO-NANOIMPRINT TECHNOLOGY, IMPRINT APPARATUS, AND CURABLE COMPOSITION

(71) Applicant: CANON KABUSHIKI KAISHA, Tokyo (JP)

(72) Inventors: Toshiki Ito, Kawasaki (JP); Tomonori Otani, Iruma (JP); Niyaz Khusnatdinov, Round Rock, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 405 days.

(21) Appl. No.: 16/552,815

(22) Filed: Aug. 27, 2019

(65) Prior Publication Data

US 2019/0391483 A1    Dec. 26, 2019

Related U.S. Application Data

(63) Continuation of application No. PCT/JP2018/008157, filed on Mar. 2, 2018.

(60) Provisional application No. 62/524,706, filed on Jun. 26, 2017, provisional application No. 62/468,470, filed on Mar. 8, 2017.

(51) Int. Cl.
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01)

(58) Field of Classification Search
CPC ........ B82Y 10/00; B82Y 40/00; G03F 7/0002
See application file for complete search history.

(56) References Cited

U.S. PATENT DOCUMENTS

| 7,157,036 B2 | 1/2007 | Choi et al. |
| 7,307,118 B2 | 12/2007 | Xu et al. |

(Continued)

FOREIGN PATENT DOCUMENTS

| CN | 101706638 A | 12/2010 |
| JP | 2008-502157 A | 1/2008 |

(Continued)

OTHER PUBLICATIONS

Notification of Reason for Refusal in Korean Application No. 10-2019-7028626 (dated Jul. 2021).

(Continued)

*Primary Examiner* — James Sanders
(74) *Attorney, Agent, or Firm* — Venable LLP

(57) ABSTRACT

A method for forming a pattern by using a photo-nanoimprint process includes performing, on each of a plurality of shot areas on a surface of a substrate: a step (1) of dispensing liquid droplets of a curable composition (A) dropwise discretely; a step (2) of bringing the curable composition (A) and a mold into contact with each other; a step (3) of irradiating the curable composition (A) with light; and a step (4) of releasing the mold from a cured product of the curable composition (A), in which when steps from the step (2) to the step (4) are collectively called an imprinting step (Im), before the imprinting step (Im) is performed on one shot area on which the step (1) has already been performed out of the plurality of shot areas, the step (1) is performed on another shot area selected from the plurality of shot areas.

6 Claims, 4 Drawing Sheets

(56) References Cited

U.S. PATENT DOCUMENTS

| | | |
|---|---|---|
| 7,837,921 B2 | 11/2010 | Xu et al. |
| 8,133,427 B2 | 3/2012 | Tada et al. |
| 8,142,703 B2 | 3/2012 | Xu et al. |
| 8,152,511 B2 | 4/2012 | Xu et al. |
| 8,268,220 B2 | 9/2012 | Xu et al. |
| 9,039,402 B2 | 5/2015 | Kawakami et al. |
| 9,796,803 B2 | 10/2017 | Kitagawa et al. |
| 10,353,286 B2 | 7/2019 | Usui |
| 10,416,553 B2 | 9/2019 | Usui |
| 2005/0160934 A1 | 7/2005 | Xu et al. |
| 2006/0108710 A1 | 5/2006 | Xu et al. |
| 2006/0279024 A1 | 12/2006 | Choi et al. |
| 2007/0272825 A1 | 11/2007 | Xu et al. |
| 2010/0098847 A1 | 4/2010 | Truskett et al. |
| 2010/0233377 A1 | 9/2010 | Aoki et al. |
| 2011/0215503 A1 | 9/2011 | Xu et al. |
| 2012/0076950 A1 | 3/2012 | Kodama |
| 2017/0283620 A1 | 10/2017 | Otani et al. |
| 2017/0283632 A1 | 10/2017 | Chiba et al. |
| 2017/0285462 A1 | 10/2017 | Ito |
| 2017/0285463 A1 | 10/2017 | Ito et al. |
| 2017/0285464 A1 | 10/2017 | Ito et al. |
| 2017/0285465 A1 | 10/2017 | Iimura et al. |
| 2017/0285466 A1 | 10/2017 | Chiba et al. |
| 2019/0030785 A1 | 1/2019 | Kato et al. |
| 2019/0204733 A1 | 7/2019 | Usui |

FOREIGN PATENT DOCUMENTS

| | | |
|---|---|---|
| JP | 2009-083172 A | 4/2009 |
| JP | 2010-080632 A | 4/2010 |
| JP | 2010-239118 A | 10/2010 |
| JP | 4791357 B2 | 10/2011 |
| JP | 2011-231308 A | 11/2011 |
| JP | 2012-4515 A | 1/2012 |
| JP | 2014-024322 A | 2/2014 |
| JP | 2014-132669 A | 7/2014 |
| JP | 2016-134608 A | 7/2016 |
| KR | 10-2010-0035107 A | 4/2010 |
| KR | 10-2015-0013813 A | 2/2015 |
| TW | 201135363 A1 | 10/2011 |
| TW | 201613741 A | 4/2016 |
| TW | 201642031 A | 12/2016 |
| WO | 2005/000552 A2 | 1/2005 |
| WO | 2005/120834 A2 | 12/2005 |
| WO | 2018/163995 A1 | 9/2018 |
| WO | 2018/164015 A1 | 9/2018 |
| WO | 2018/164016 A1 | 9/2018 |
| WO | 2018/164017 A1 | 9/2018 |

OTHER PUBLICATIONS

Notice of Reasons for Refusal in Japanese Application No. 2019-504551 (dated Oct. 2021).
Office Action in Taiwanese Application No. 107107548 (dated Nov. 5, 2018).
Office Action in Taiwanese Application No. 107107548 (dated Mar. 21, 2019).
International Search Report in International Application No. PCT/JP2018/008157 (dated May 22, 2018).
Shravanthi Reddy et al., "Simulation of Fluid Flow in the Step and Flash Imprint Lithography Process," 82 Microelectron. Eng. 60-70 (Jul. 2005).
Chiba et al., U.S. Appl. No. 16/556,836, filed Aug. 30, 2019.
Otani et al., U.S. Appl. No. 16/548,371, filed Aug. 22, 2019.
Kato et al., U.S. Appl. No. 16/555,429, filed Aug. 29, 2019.
Notice of Reasons for Refusal in Japanese Application No. 2019-504550 (dated Sep. 2021).
International Preliminary Report on Patentability in International Application No. PCT/JP2018/008157 (dated Sep. 2019).

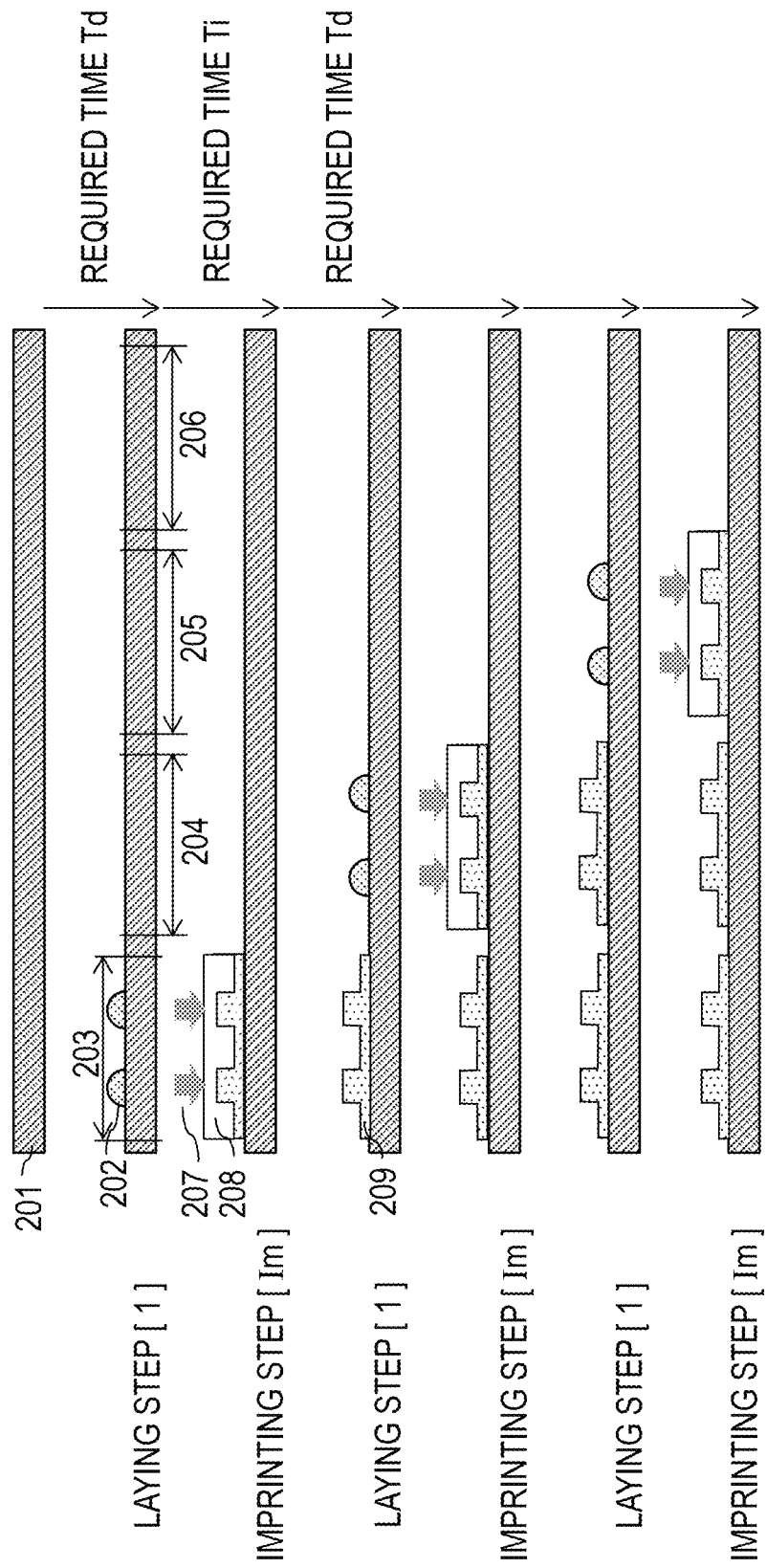

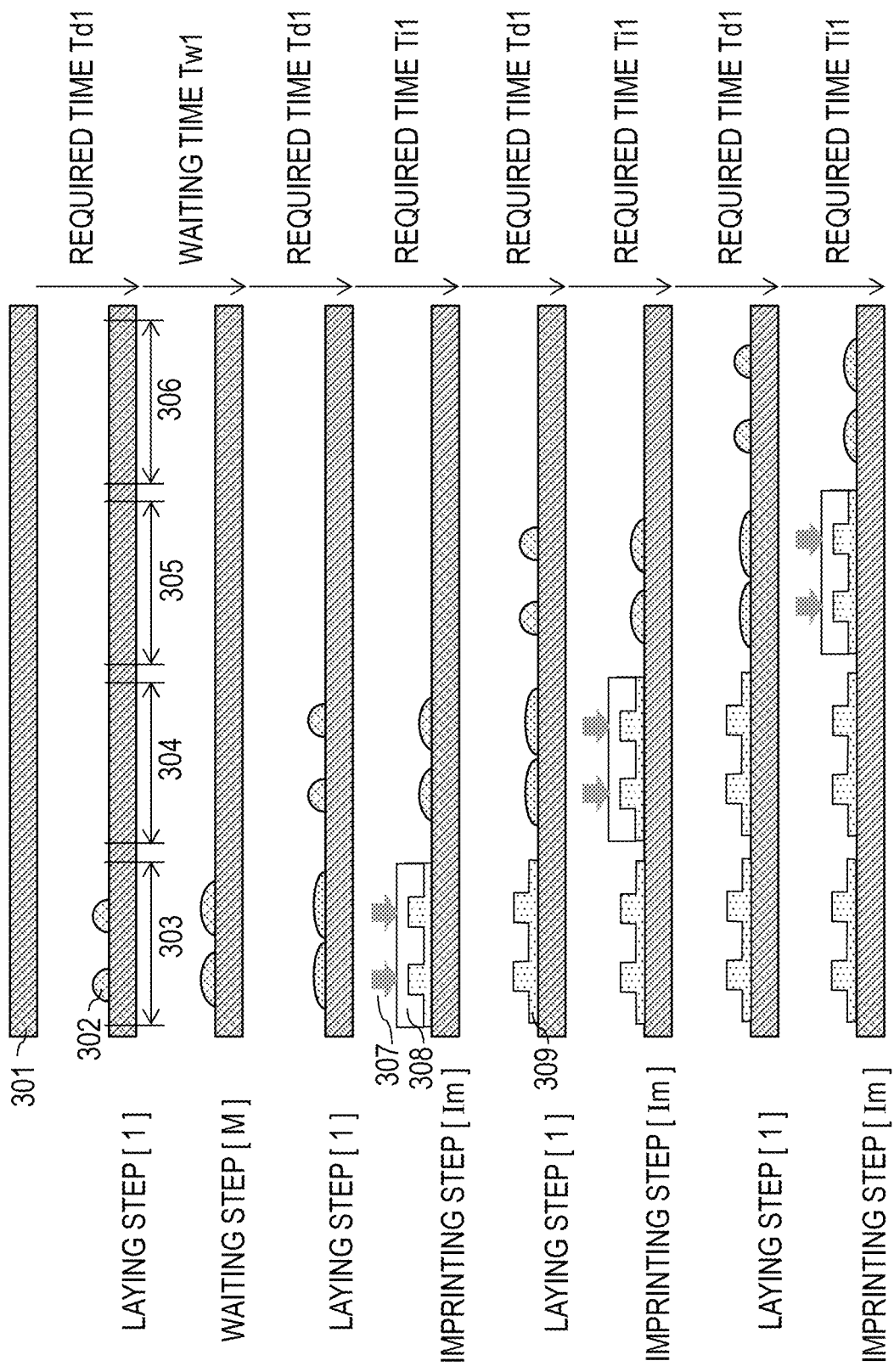

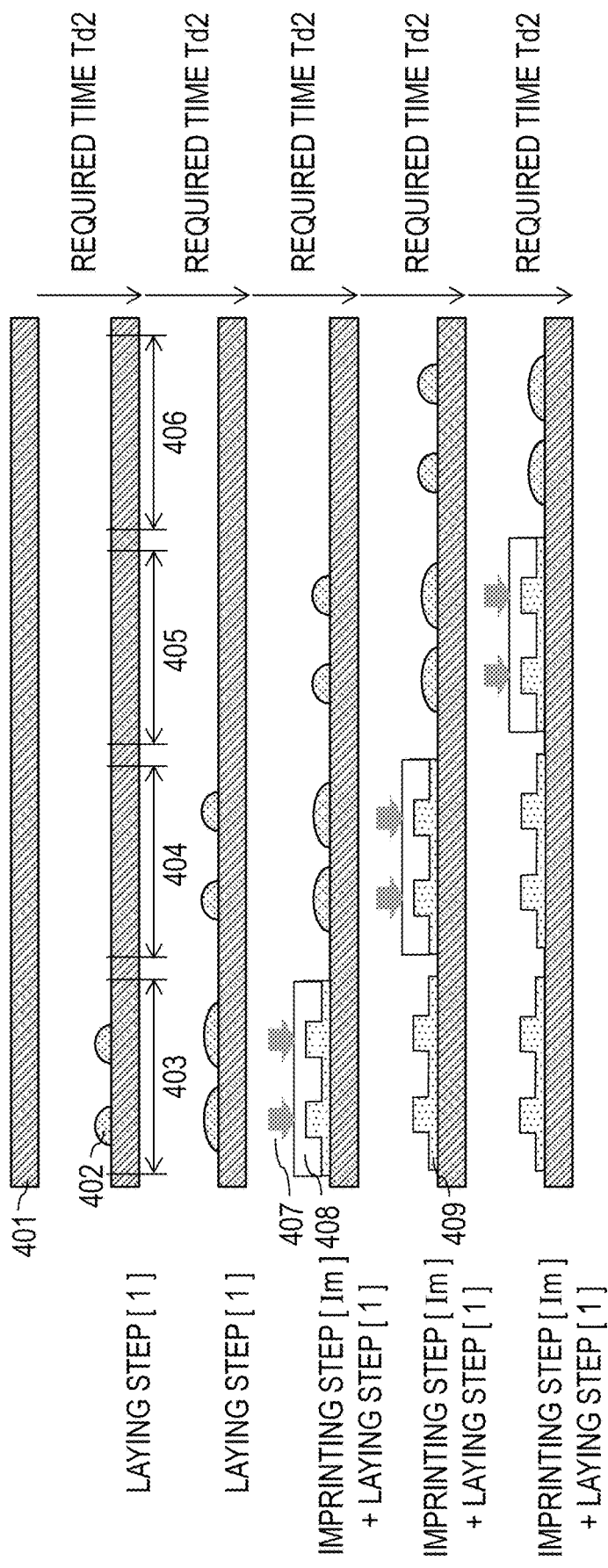

METHOD FOR FORMING PATTERN BY USING PHOTO-NANOIMPRINT TECHNOLOGY, IMPRINT APPARATUS, AND CURABLE COMPOSITION

CROSS-REFERENCE TO RELATED APPLICATIONS

This application is a Continuation of International Patent Application No. PCT/JP2018/008157, filed Mar. 2, 2018, which claims the benefit of U.S. Provisional Patent Application No. 62/468,470, filed Mar. 8, 2017 and U.S. Provisional Patent Application No. 62/524,706, filed Jun. 26, 2017, all of which are hereby incorporated by reference herein in their entirety.

BACKGROUND OF THE INVENTION

Field of the Invention

The present invention relates to a method for forming a pattern by using a photo-nanoimprint technology, an imprint apparatus using therefore, and a curable compound used therefore.

Description of the Related Art

There has been a growing requirement for miniaturization in a semiconductor device, a MEMS, or the like, and hence a photo-nanoimprint technology has been attracting attention as a microfabrication technology. In the photo-nanoimprint technology, a photocurable composition (resist) is cured in a state in which a mold having a fine groove/land pattern formed on its surface is pressed against a substrate (wafer) having applied thereto the photocurable composition. Thus, the groove/land pattern of the mold is transferred onto the cured film of the photocurable composition and hence the pattern is formed on the substrate. According to the photo-nanoimprint technology, a fine structural body of the order of several nanometers can be formed on the substrate.

A method for forming a pattern by a photo-nanoimprint technology disclosed in Japanese Patent No. 4791357 is described with reference to a schematic sectional view of FIG. 1. First, a liquid resist 102 is dispensed dropwise discretely onto a pattern forming area on a substrate 101 by using an inkjet method (laying step (1), FIG. 1(1)). Liquid droplets of the resist 102 dispensed dropwise spread on the substrate as indicated by an arrow 103 indicating a direction in which a liquid droplet spreads (FIG. 1(1)). The phenomenon is called prespread. Next, the resist 102 is molded with a mold 104 that has a pattern formed thereon and is transparent to irradiation light 105 to be described later (mold contacting step (2), FIG. 1(2)). In the mold contacting step (2), the liquid droplets of the resist 102 spread over the entire region of a gap between the substrate 101 and the mold 104 (FIG. 1(2)). The phenomenon is called spread. In addition, in the mold contacting step (2), the resist 102 is filled into a groove portion on the mold 104 by the capillary phenomenon as indicated by the arrow 103 indicating a direction in which a liquid droplet spreads (enlarged portion of FIG. 1(2)). The filling phenomenon is called fill. A time period from contact between the mold 104 and the resist 102 to the completion of the spread and the fill is called a filling time. After the completion of the filling of the resist 102, the resist 102 is cured by being irradiated with the irradiation light 105 (light irradiating step (3), FIG. 1(3)), and then the mold is released from the cured product (releasing step (4), FIG. 1(4)). The performance of those steps results in the formation of a cured film (photocured film) 106 having a predetermined pattern shape on the substrate 101.

A series of step units ranging from the mold contacting step (2) to the releasing step (4) is referred to as "imprinting step (Im)". In addition, a series of step units ranging from the laying step (1) to the releasing step (4) is referred to as "shot", and an area where the mold is in contact with the resist, in other words, an area where a pattern is formed on the substrate 101 is referred to as "shot area". When the laying step (1) and the imprinting step (Im) are performed on predetermined areas on a substrate 201 in a predetermined order and a predetermined number of times as illustrated in FIG. 2, the substrate 201 having, at desired positions, cured films 209 each having a desired groove/land pattern shape can be obtained.

The photo-nanoimprint technology disclosed in Japanese Patent No. 4791357 has involved a problem in that a time period (filling time) from the initiation of the contact of the mold to the completion of the spread and the fill is long, and hence throughput is low.

As described in the foregoing, the liquid droplets of the resist dispensed dropwise discretely spread on the substrate gradually before the mold is brought into contact with the resist (prespread). Accordingly, in the case where a waiting step is provided in a period from the completion of the laying step (1) to the initiation of the mold contacting step (2) in which the mold is brought into contact with the resist, the prespread advances to a larger extent, and hence a time required for spread after the contact of the mold can be made shorter than that in the case where no waiting step is provided. However, the waiting step is required, and hence the extent to which a required time for one shot is shortened is small and no large improvement in throughput is achieved.

In view of the foregoing, an object of the present invention is to provide a photo-nanoimprint technology having a short filling time and high throughput.

SUMMARY OF THE INVENTION

In order to solve the above-mentioned problem, according to one embodiment of the present invention, there is provided a method for forming a pattern by using a photo-nanoimprint process, including performing, on each of a plurality of shot areas on a surface of a substrate, in this order:

a laying step (1) of dispensing liquid droplets of a curable composition (A) containing at least a polymerizable compound (a) dropwise discretely to lay the liquid droplets;

a mold contacting step (2) of bringing the curable composition (A) and a mold into contact with each other;

a light irradiating step (3) of irradiating the curable composition (A) with light from a mold side to cure the composition; and a releasing step (4) of releasing the mold from a cured product of the curable composition (A), in which when steps from the mold contacting step (2) to the releasing step (4) are collectively called an imprinting step (Im), before the imprinting step (Im) is performed on one shot area on which the laying step (1) has already been performed out of the plurality of shot areas, the laying step (1) is performed on another shot area selected from the plurality of shot areas.

According to another embodiment of the present invention, there is provided a method for forming a pattern by using a photo-nanoimprint process, including performing, on each of a plurality of shot areas on a surface of a substrate, in this order:

a laying step (1) of dispensing liquid droplets of a curable composition (A) containing at least a component (a) serving as a polymerizable compound dropwise discretely to lay the liquid droplets;

a mold contacting step (2) of bringing the curable composition (A) and a mold into contact with each other;

a light irradiating step (3) of irradiating the curable composition (A) with light from a mold side to cure the composition; and a releasing step (4) of releasing the mold from a cured product of the curable composition (A), in which when steps from the mold contacting step (2) to the releasing step (4) are collectively called an imprinting step (Im), the laying step (1) on one shot area selected from the plurality of shot areas and the imprinting step (Im) on another shot area on which the laying step (1) has already been performed out of the plurality of shot areas are simultaneously initiated, and are simultaneously ended.

Further features of the present invention will become apparent from the following description of exemplary embodiments with reference to the attached drawings.

BRIEF DESCRIPTION OF THE DRAWINGS

FIG. 2 is a schematic sectional view for illustrating an example of a procedure for the performance of a photo-nanoimprint technology on a plurality of shot areas on one and the same substrate.

FIG. 3 is a schematic sectional view for illustrating a method for forming a pattern by a photo-nanoimprint technology according to a first embodiment of the present invention.

FIG. 4 is a schematic sectional view for illustrating a method for forming a pattern by a photo-nanoimprint technology according to a second embodiment of the present invention.

DESCRIPTION OF THE EMBODIMENTS

[Curable Composition (A)]

Figure 1:
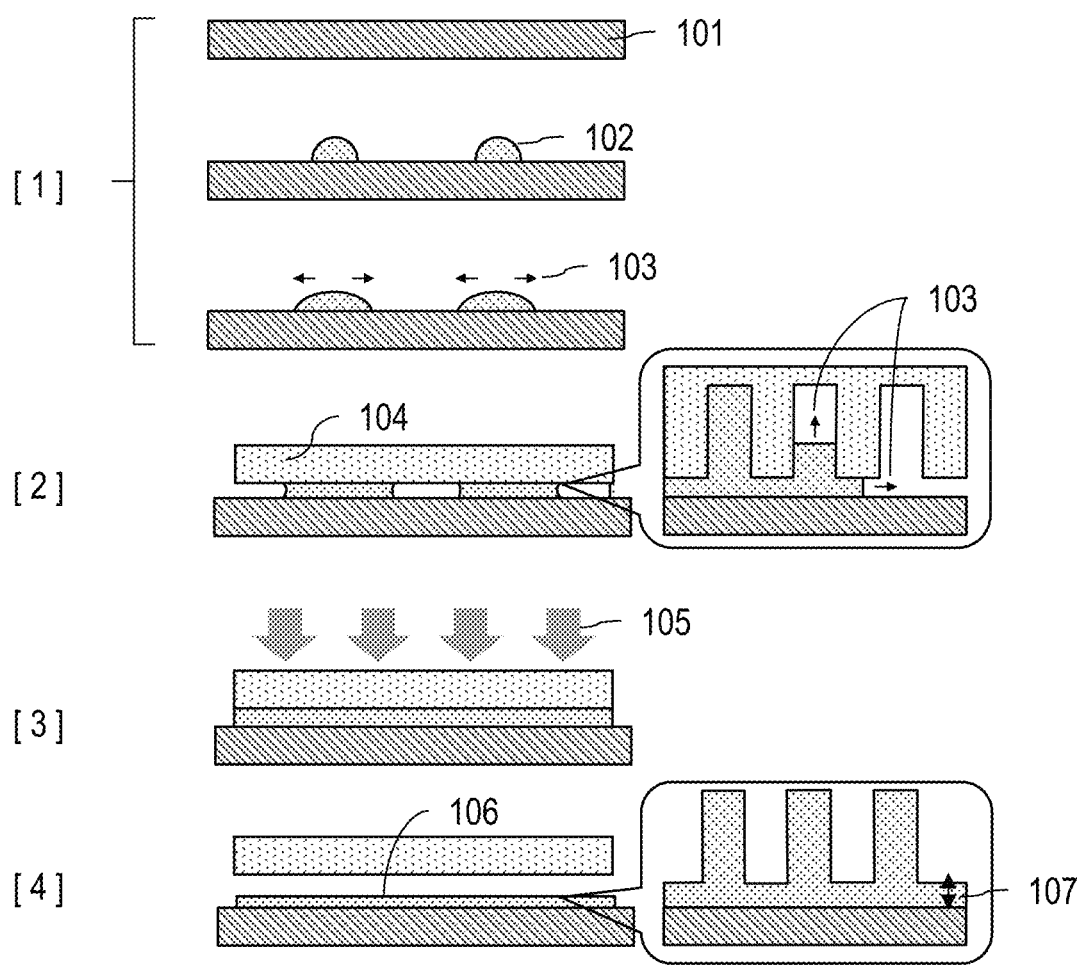
FIG. 1 is a schematic sectional view for illustrating an example of a method for forming a pattern by a photo-nanoimprint technology.

A curable composition (A) according to the present invention is a compound containing at least a component (a) serving as a polymerizable compound. The curable composition (A) according to the present invention may further contain a component (b) serving as a photopolymerization initiator, a component (c) serving as a non-polymerizable compound, or a component (d) serving as a solvent.

In addition, the term "cured film" as used herein means a film obtained by polymerizing and curing the curable composition (A) on a substrate. The shape of the cured film is not particularly limited, and the film may have a pattern shape on its surface.

Each component is hereinafter described in detail.

<Component (a): Polymerizable Compound>

The component (a) serving as the polymerizable compound as used herein is a compound that reacts with a polymerization factor (such as a radical) generated from the component (b) serving as a photopolymerization initiator to form a film formed of a polymer compound by a chain reaction (polymerization reaction).

As such polymerizable compound, there is given, for example, a radical polymerizable compound. The component (a) serving as the polymerizable compound may be formed of only one kind of polymerizable compound or a plurality of kinds of polymerizable compounds.

It is preferred that the radical polymerizable compound be a compound having one or more acryloyl groups or methacryloyl groups, that is, a (meth)acrylic compound. Therefore, it is preferred that the curable composition (A) according to the present invention contain the (meth)acrylic compound as the component (a), it is more preferred that a main component for the component (a) be the (meth)acrylic compound, and it is most preferred that the component (a) be the (meth)acrylic compound. The phrase "a main component for the component (a) is the (meth)acrylic compound" described herein means that the (meth)acrylic compound accounts for 90 wt % or more of the component (a).

When the radical polymerizable compound is formed of a plurality of kinds of compounds each having one or more acryloyl groups or methacryloyl groups, the compound preferably contains a monofunctional (meth)acrylic monomer and a multifunctional (meth)acrylic monomer. This is because the combination of the monofunctional (meth)acrylic monomer and the multifunctional (meth)acrylic monomer provides a cured film having a high mechanical strength.

Monofunctional (meth)acrylic compounds each having one acryloyl group or methacryloyl group are exemplified by, but not limited to, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl (meth)acrylate, 2,4,6-tribromophenoxyethyl (meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl(meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, isoamyl (meth)acrylate, hexyl (meth)acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth)acrylate, undecyl (meth)acrylate, dodecyl (meth)acrylate, lauryl (meth)acrylate, stearyl (meth)acrylate, isostearyl (meth)acrylate, benzyl (meth)acrylate, tetrahydrofurfuryl (meth)acrylate, butoxyethyl (meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl (meth)acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, and N,N-dimethylaminopropyl (meth)acrylamide.

Examples of commercial products corresponding to the monofunctional (meth)acrylic compounds include, but not limited to: ARONIX (trademark) M101, M102, M110, M111, M113, M117, M5700, TO-1317, M120, M150, and M156 (all of which are manufactured by Toagosei Co., Ltd.); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of which are manufactured by Osaka Organic Chemical Industry Ltd.); LIGHT ACRYLATE BO-A, EC-A, DMP-A, THF-A, HOP-A, HOA-MPE, HOA-MPL, PO-A, P-200A, NP-4EA, and NP-8EA, and EPOXY ESTER M-600A (all of which are manufactured by Kyoeisha Chemical Co., Ltd.); KAYARAD (trademark) TC110S, R-564, and R-128H (all of which are manufactured by Nippon Kayaku Co., Ltd.); NK Ester AMP-10G and AMP-20G (both of which are manufactured by Shin-Nakamura Chemical Co., Ltd.); FA-511A, 512A, and 513A (all of which are manufactured by Hitachi Chemical Co., Ltd.); PHE, CEA, PHE-2, PHE-4, BR-31, BR-31M, and BR-32 (all of which are manufactured by DKS); VP (manufactured by BASF); and ACMO, DMAA, and DMAPAA (all of which are manufactured by Kohjin Co., Ltd.).

In addition, multifunctional (meth)acrylic compounds each having two or more acryloyl groups or methacryloyl groups are exemplified by, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, dimethyloltricyclodecane di(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, 1,9-nonanediol di(meth)acrylate, 1,10-decanediol di(meth)acrylate, 1,3-adamantane dimethanol di(meth)acrylate, tris(2-hydroxyethyl)i socyanurate tri (meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl) propane, PO-modified 2,2-bis(4-((meth)acryloxy)phenyl) propane, and EO,PO-modified 2,2-bis(4-((meth)acryloxy)phenyl)propane.

Examples of commercial products corresponding to the multifunctional (meth)acrylic compounds include, but not limited to: YUPIMER (trademark) UV SA1002 and SA2007 (both of which are manufactured by Mitsubishi Chemical Corporation); Viscoat #195, #230, #215, #260, #335HP, #295, #300, #360, #700, GPT, and 3PA (all of which are manufactured by Osaka Organic Chemical Industry Ltd.); LIGHT ACRYLATE 4EG-A, 9EG-A, NP-A, DCP-A, BP-4EA, BP-4PA, TMP-A, PE-3A, PE-4A, and DPE-6A (all of which are manufactured by Kyoeisha Chemical Co., Ltd.); KAYARAD (trademark) PET-30, TMPTA, R-604, DPHA, DPCA-20, -30, -60, and -120, and HX-620, D-310, and D-330 (all of which are manufactured by Nippon Kayaku Co., Ltd.); ARONIX (trademark) M208, M210, M215, M220, M240, M305, M309, M310, M315, M325, and M400 (all of which are manufactured by Toagosei Co., Ltd.); and Ripoxy (trademark) VR-77, VR-60, and VR-90 (all of which are manufactured by Showa Denko KK).

In the above-mentioned compound group, the term "(meth)acrylate" means an acrylate or a methacrylate having an alcohol residue equal to the acrylate. The term "(meth) acryloyl group" means an acryloyl group or a methacryloyl group having an alcohol residue equal to the acryloyl group. The abbreviation "EO" refers to ethylene oxide, and the term "EO-modified compound A" means a compound in which a (meth)acrylic acid residue and an alcohol residue of the compound A are bonded to each other through a block structure formed of an oligomer or a polymer of an ethylene oxide group. In addition, the abbreviation "PO" refers to propylene oxide, and the term "PO-modified compound B" means a compound in which a (meth)acrylic acid residue and an alcohol residue of the compound B are bonded to each other through a block structure formed of an oligomer or a polymer of a propylene oxide group.

When the blending ratio of the component (a) serving as the polymerizable compound in the curable composition (A) is set to 50 wt % or more with respect to the total weight of the component (a), the component (b), and the component (c), a cured film to be obtained can be turned into a cured film having some degree of mechanical strength.

<Component (b): Photopolymerization Initiator>

The component (b) serving as the photopolymerization initiator as used herein is a compound that senses light having a predetermined wavelength to generate the above-mentioned polymerization factor (radical). Specifically, the photopolymerization initiator is a polymerization initiator (radical generator) that generates a radical with light (an infrared ray, a visible ray, an ultraviolet ray, a far ultraviolet ray, an X-ray, a charged particle ray such as an electron beam, or a radiation). The component (b) may be formed of one kind of photopolymerization initiator or a plurality of kinds of photopolymerization initiators.

Examples of the radical generator include, but not limited to: 2,4,5-triarylimidazole dimers that may have a substituent, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone and benzophenone derivatives, such as N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives, such as 2-benzyl-2-dimethylamino-1-(4-morpholinophenyl)-butanone-1,2-methyl-1-[4-(methylthio)phenyl]-2-morpholino-propan-1-one; quinones, such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives, such as benzoin methyl ether, benzoin ethyl ether, and benzoin phenyl ether; benzoin and benzoin derivatives, such as methylbenzoin, ethylbenzoin, and propylbenzoin; benzyl derivatives, such as benzyl dimethyl ketal; acridine derivatives, such as 9-phenylacridine and 1,7-bis(9,9'-acridinyl)heptane; N-phenylglycine derivatives, such as N-phenylglycine; acetophenone and acetophenone derivatives, such as 3-methylacetophenone, acetophenone benzyl ketal, 1-hydroxycyclohexyl phenyl ketone, and 2,2-dimethoxy-2-phenylacetophenone; thioxanthone and thioxanthone derivatives, such as diethylthioxanthone, 2-isopropylthioxanthone, and 2-chlorothioxanthone; acylphosphine oxide derivatives, such as 2,4,6-trimethylbenzoyl diphenyl phosphine oxide, bis(2,4,6-trimethylbenzoyl) phenyl phosphine oxide, and bis-(2,6-dimethoxybenzoyl)-2,4,4-trimethylpentyl phosphine oxide; oxime ester derivatives, such as 1,2-octanedione, 1-[4-(phenylthio)-, 2-(O-benzoyloxime)] and ethanone, 1-[9-ethyl-6-(2-methylbenzoyl)-9H-carbazol-3-yl]-, 1-(O-acetyloxime); xanthone; fluorenone; benzaldehyde; fluorene; anthraquinone; triphenylamine; carbazole; 1-(4-isopropylphenyl)-2-hydroxy-2-methylpropan-1-one; and 2-hydroxy-2-methyl-1-phenylpropan-1-one.

Examples of commercial products corresponding to the radical generator include, but not limited to, Irgacure 184, 369, 651, 500, 819, 907, 784, and 2959, CGI-1700, -1750, and -1850, CG24-61, Darocur 1116 and 1173, Lucirin (trademark) TPO, LR8893, and LR8970 (all of which are manufactured by BASF), and Ubecryl P36 (manufactured by UCB).

Of those, the component (b) is preferably an acylphosphine oxide-based polymerization initiator. The acylphosphine oxide-based polymerization initiator is, of the examples described above, an acylphosphine oxide compound, such as 2,4,6-trimethylbenzoyl diphenyl phosphine oxide, bis(2,4,6-trimethylbenzoyl) phenyl phosphine oxide, or bis(2,6-dimethoxybenzoyl)-2,4,4-trimethylpentyl phosphine oxide.

The blending ratio of the component (b) serving as the photopolymerization initiator in the curable composition (A) is desirably 0.1 wt % or more and 50 wt % or less with respect to the total weight of the component (a), the component (b), and the component (c), i.e., the total weight of all components except the component (d) serving as a solvent. In addition, the blending ratio is preferably 0.1 wt % or more and 20 wt % or less, more preferably more than 10 wt % and 20 wt % or less.

When the blending ratio of the component (b) in the curable composition (A) is set to 0.1 wt % or more with respect to the total weight of the component (a), the component (b), and the component (c), the curing rate of the curing composition (A) increases and hence reaction efficiency can be improved. In addition, when the blending ratio of the component (b) is set to 50 wt % or less with respect to the total weight of the component (a), the component (b), and the component (c), a cured film to be obtained can be turned into a cured film having some degree of mechanical strength.

<Component (c): Non-Polymerizable Compound>

The curable composition (A) according to the present invention can further contain a component (c) serving as a non-polymerizable compound in addition to the component (a) and the component (b) described in the foregoing in accordance with various purposes to the extent that the effects of the present invention are not impaired. Such component (c) is, for example, a compound that is free of a polymerizable functional group, such as a (meth)acryloyl group, and is free of an ability to sense light having a predetermined wavelength to generate the polymerization factor (radical). Examples thereof include a sensitizer, a hydrogen donor, an internal release agent, a surfactant, an antioxidant, a polymer component, and other additives. Two or more kinds of the compounds may be incorporated as the component (c).

The sensitizer is a compound to be appropriately added for the purpose of accelerating a polymerization reaction or enhancing a reaction conversion ratio. As the sensitizer, there is given, for example, a sensitizing dye. The sensitizing dye is a compound that is excited by absorbing light having a specific wavelength to interact with the component (b) serving as the photopolymerization initiator. The term "interaction" described herein refers to, for example, the transfer of energy or an electron from the sensitizing dye in an excited state to the component (b) serving as the photopolymerization initiator.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

The sensitizers may be used alone or as a mixture thereof.

The hydrogen donor is a compound capable of reacting with an initiation radical generated from the component (b) serving as the photopolymerization initiator or the radical of a polymerization growth terminal to generate a more reactive radical. The hydrogen donor is preferably added when the component (b) serving as the photopolymerization initiator is a photoradical generator.

Specific examples of such hydrogen donor include, but not limited to, amine compounds, such as n-butylamine, di-n-butylamine, allylthiourea, triethylamine, triethylenetetramine, a 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine, mercapto compounds, such as 2-mercapto-N-phenylbenzimidazole and a mercaptopropionic acid ester, sulfur compounds, such as s-benzylisothiuronium-p-toluenesulfinate, and phosphorus compounds, such as tri-n-butylphosphine.

The hydrogen donors may be used alone or as a mixture thereof. In addition, the hydrogen donor may have a function as a sensitizer.

The internal release agent can be added to the curable composition (A) for the purpose of reducing an interfacial bonding force between a mold and a cured product of the curable composition (A), i.e., reducing a release force in a releasing step (4) to be described later. The term "internal" as used herein means that the release agent is added to the curable composition (A) in advance prior to the step of arranging the curable composition (A).

For example, surfactants, such as a silicone-based surfactant, a fluorine-based surfactant, and a hydrocarbon surfactant, can each be used as the internal release agent. In the present invention, the internal release agent is free of polymerizability.

Examples of the fluorine-based surfactant include a polyalkylene oxide (such as polyethylene oxide or polypropylene oxide) adduct of an alcohol having a perfluoroalkyl group, and a polyalkylene oxide (such as polyethylene oxide or polypropylene oxide) adduct of perfluoropolyether. The fluorine-based surfactant may have, for example, a hydroxyl group, an alkoxy group, an alkyl group, an amino group, or a thiol group on part (for example, as a terminal group) of its molecular structure.

As the fluorine-based surfactant, a commercial product may be used. Examples of the commercial product include MEGAFACE (trademark) F-444, TF-2066, TF-2067, and TF-2068 (all of which are manufactured by DIC Corporation), Fluorad FC-430 and FC-431 (both of which are manufactured by 3M Japan Limited), SURFLON (trademark) S-382 (manufactured by AGC), EFTOP EF-122A, 122B, and 122C, EF-121, EF-126, EF-127, and MF-100 (all of which are manufactured by Mitsubishi Materials Electronic Chemicals Co., Ltd.), PF-636, PF-6320, PF-656, and PF-6520 (all of which are manufactured by OMNOVA Solutions), UNIDYNE (trademark) DS-401, DS-403, and DS-451 (all of which are manufactured by Daikin Industries, Ltd.), and Ftergent (trademark) 250, 251, 222F, and 208G (all of which are manufactured by Neos Corporation).

In addition, the internal release agent may be the hydrocarbon surfactant. The hydrocarbon surfactant includes, for example, an alkyl alcohol polyalkylene oxide adduct, in which an alkylene oxide having 2 to 4 carbon atoms is added to an alkyl alcohol having 1 to 50 carbon atoms.

Examples of the alkyl alcohol polyalkylene oxide adduct include a methyl alcohol polyethylene oxide adduct, a decyl alcohol polyethylene oxide adduct, a lauryl alcohol polyethylene oxide adduct, a cetyl alcohol polyethylene oxide adduct, a stearyl alcohol polyethylene oxide adduct, and a stearyl alcohol polyethylene oxide/polypropylene oxide adduct. The terminal group of the alkyl alcohol polyalkylene oxide adduct is not limited to a hydroxyl group, which can be simply produced by adding a polyalkylene oxide to an alkyl alcohol. The hydroxyl group may be turned into another substituent, for example, a polar functional group, such as a carboxyl group, an amino group, a pyridyl group, a thiol group, or a silanol group, or a hydrophobic functional group, such as an alkyl group or an alkoxy group.

As the alkyl alcohol polyalkylene oxide adduct, a commercial product may be used. Examples of the commercial product include polyoxyethylene methyl ether (methyl alcohol polyethylene oxide adduct) (BLAUNON MP-400, MP-550, and MP-1000) manufactured by Aoki Oil Industrial Co., Ltd., polyoxyethylene decyl ether (decyl alcohol polyethylene oxide adduct) (FINESURF D-1303, D-1305, D-1307, and D-1310) manufactured by Aoki Oil Industrial Co., Ltd., polyoxyethylene lauryl ether (lauryl alcohol polyethylene oxide adduct) (BLAUNON EL-1505) manufactured by Aoki Oil Industrial Co., Ltd., polyoxyethylene cetyl ether (cetyl alcohol polyethylene oxide adduct) (BLAUNON CH-305 and CH-310) manufactured by Aoki Oil Industrial Co., Ltd., polyoxyethylene stearyl ether (stearyl alcohol polyethylene oxide adduct) (BLAUNON SR-705, SR-707, SR-715, SR-720, SR-730, and SR-750) manufactured by Aoki Oil Industrial Co., Ltd., random polymerization-type polyoxyethylene polyoxypropylene stearyl ether (BLAUNON SA-50/50 1000R and SA-30/70 2000R) manufactured by Aoki Oil Industrial Co., Ltd., polyoxyethylene methyl ether (Pluriol (trademark) A760E) manufactured by BASF, and polyoxyethylene alkyl ethers (EMULGEN Series) manufactured by Kao Chemicals.

Of those hydrocarbon surfactants, an alkyl alcohol polyalkylene oxide adduct is preferred as the internal release agent, and a long-chain alkyl alcohol polyalkylene oxide adduct is more preferred. The internal release agents may be used alone or as a mixture thereof.

The blending ratio of the component (c) serving as the non-polymerizable compound in the curable composition (A) is desirably 0 wt % or more and 50 wt % or less with respect to the total weight of the component (a), the component (b), and the component (c), i.e., the total weight of the components of the curable composition (A) except the component (d) serving as a solvent. In addition, the blending ratio is preferably 0.1 wt % or more and 50 wt % or less, more preferably 0.1 wt % or more and 20 wt % or less. When the blending ratio of the component (c) is set to 50 wt % or less with respect to the total weight of the component (a), the component (b), and the component (c), a cured film to be obtained can be turned into a cured film having some degree of mechanical strength.

<Component (d): Solvent>

The curable composition (A) according to the present invention may contain a component (d) serving as a solvent. The component (d) is not particularly limited as long as the component is a solvent that dissolves the component (a), the component (b), and the component (c). The solvent is preferably a solvent having a boiling point at normal pressure of 80° C. or more and 200° C. or less. The solvent is more preferably a solvent having at least one of an ester structure, a ketone structure, a hydroxyl group, or an ether structure. The solvent is specifically, for example, a single solvent selected from propylene glycol monomethyl ether acetate, propylene glycol monomethyl ether, cyclohexanone, 2-heptanone, γ-butyrolactone, and ethyl lactate, or a mixed solvent of two or more kinds thereof.

<Temperature at Time of Blending of Curable Composition (A)>

When the curable composition (A) according to the present invention is prepared, the respective components are mixed and dissolved under a predetermined temperature condition. Specifically, the preparation is performed in a range of from 0° C. or more to 100° C. or less.

<Viscosity of Curable Composition (A)>

The curable composition (A) according to the present invention is preferably liquid. This is because in a mold contacting step (2) to be described later, the spread and fill of the curable composition (A) are quickly completed, in other words, a filling time is short.

The viscosity of the composition of the components of the curable composition (A) according to the present invention except the component (d) serving as a solvent at 25° C. is preferably 1 mPa·s or more and less than 40 mPa·s. In addition, the viscosity is more preferably 1 mPa·s or more and less than 20 mPa·s. When the viscosity of the curable composition (A) is 40 mPa·s or more, the composition cannot be applied by the inkjet system in which liquid droplets are arranged discretely in accordance with the density of a desired pattern to uniformize the thickness of a residual film, and hence a high-accuracy pattern can be formed. In addition, the case where the viscosity is lower than 1 mPa·s is not preferred because application unevenness may occur owing to the flow of the curable composition (A) at the time of its application (arrangement), or the composition may flow out of an end portion of the mold in the contacting step to be described later.

<Surface Tension of Curable Composition (A)>

With regard to the surface tension of the curable composition (A) according to the present invention, the surface tension of the composition of the components except the component (d) serving as a solvent at 23° C. is preferably 5 mN/m or more and 70 mN/m or less. In addition, the surface tension is more preferably 7 mN/m or more and 50 mN/m or less, still more preferably 10 mN/m or more and 40 mN/m or less. In this case, as the surface tension becomes higher, e.g., 5 mN/m or more, a stronger capillary force acts, and hence filling (the spread and the fill) is completed within a shorter time period at the time of the bringing of the curable composition (A) into contact with the mold (S. Reddy, R. T. Bonnecaze/Microelectronic Engineering, 82 (2005) 60-70). In addition, when the surface tension is set to 70 mN/m or less, a cured film obtained by curing the curable composition (A) becomes a cured film having surface smoothness.

<Contact Angle of Curable Composition (A)>

With regard to the contact angle of the curable composition (A) according to the invention, the contact angle of the composition of the components except the component (d) serving as a solvent is preferably 0° or more and 90° or less with respect to each of both the surface of the substrate and the surface of the mold. When the contact angle is more than 90°, a capillary force acts in a negative direction (direction in which a contact interface between the mold and the curable composition (A) is shrunk) in a mold pattern or in a gap between the substrate and the mold, and hence the composition is not filled. In addition, the contact angle is particularly preferably 0° or more and 30° or less. As the contact angle becomes lower, a stronger capillary force acts and hence a filling rate increases (S. Reddy, R. T. Bonnecaze/Microelectronic Engineering, 82 (2005) 60-70).

<Volatility of Curable Composition (A)>

The volatility of the composition of the components of the curable composition (A) according to the present invention except the component (d) serving as a solvent is preferably as low as possible. In the present invention, the curable composition (A) has a feature in that as described later, a predetermined interval is provided in a period after the composition has been dispensed dropwise onto the substrate in the laying step (1) and before the composition is brought into contact with the mold in the mold contacting step (2). The composition is exposed to an atmospheric gas during the interval. The composition of the components of the curable composition (A) except the component (d) serving as a solvent may volatilize during the interval, and hence the composition preferably has such composition that the ratio at which its volume reduces owing to the volatilization becomes 10% or less. The weight reduction ratio of the composition of the components of the curable composition (A) except the component (d) serving as a solvent (d) 10 seconds after the liquid droplets of the curable composition (A) have been dispensed dropwise discretely to be laid in the laying step (1) is preferably 10% or less. When the weight reduction ratio is more than 10%, an inconvenience in terms of pattern accuracy in which a pattern height or a residual film thickness becomes smaller than a desired value, or such an inconvenience that a desired physical property value is not obtained in association with a fluctuation in composition occurs. Specifically, the vapor pressure of the composition of the components of the curable composition (A) except the component (d) serving as a solvent at 20° C. is preferably 0.5 kPa or less, more preferably 0.2 kPa or less, particularly preferably 0.1 kPa or less.

<Impurities Mixed in Curable Composition (A)>

It is preferred that the curable composition (A) according to the present invention be free of impurities to the extent possible. The term "impurities" as used herein refers to components except the component (a), the component (b), the component (c), and the component (d) described above.

Thus, it is preferred that the curable composition (A) according to the present invention be obtained through a purification step. Such purification step is preferably filtration using a filter or the like. When the filtration using a filter is performed, specifically, it is preferred that the component (a) and the component (b) described in the foregoing and additive components to be added as required be mixed, and then the mixture be filtered with a filter having a pore diameter of, for example, 0.001 μm or more and 5.0 μm or less. It is more preferred that the filtration using a filter be performed in a plurality of stages or be repeated a plurality of times. In addition, the filtered liquid may be filtered again. A plurality of filters having different pore diameters may be used to perform the filtration. A filter made of, for example, a polyethylene resin, a polypropylene resin, a fluororesin, or a nylon resin can be used as the filter to be used in the filtration. However, the filter is not particularly limited thereto.

Impurities, such as particles, which are mixed in the curable composition (A), can be removed through such purification step. Thus, the impurities, such as the particles, can be prevented from forming unexpected unevenness in the cured film to be obtained after the curable composition (A) is cured to cause a pattern defect.

When the curable composition (A) according to the present invention is used for the manufacture of a semiconductor integrated circuit, it is preferred to avoid the mixing of metal atom-containing impurities (metal impurities) in the curable composition (A) to the extent possible in order to prevent the operation of a product from being inhibited. In this case, the concentration of the metal impurities in the curable composition (A) is preferably 10 ppm or less, more preferably 100 ppb or less.

[Method for Forming Pattern]

Next, steps of a method for forming a pattern according to the present invention are described with reference to a schematic sectional view of FIG. 1.

A cured film obtained by the method for manufacturing a cured film having a pattern shape according to the present invention is preferably a film having a pattern having a size of 1 nm or more and 10 mm or less. In addition, the cured film is more preferably a film having a pattern having a size of 10 nm or more and 100 μm or less. In general, a pattern forming technology for producing a film having a pattern (uneven structure) of a nanosize (1 nm or more and 100 nm or less) through the use of light is called a photo-nanoimprint method. The method for forming a pattern of the present invention uses the photo-nanoimprint method. Each step is hereinafter described.

<Laying Step (1)>

In the laying step (1), as illustrated in FIG. 1, liquid droplets of the curable composition (A) 102 are dispensed dropwise discretely onto the substrate 101 to be arranged thereon. An inkjet method is particularly preferred as a method for the arrangement. The liquid droplets of the curable composition (A) 102 are densely arranged on a substrate facing an area where groove portions are densely present on the mold 104, and are sparsely arranged on a substrate facing an area where groove portions are sparsely present. Thus, the thickness of a residual film 107 to be described later can be controlled to a uniform value irrespective of the density of a pattern on the mold 104.

The substrate 101 on which the curable composition (A) 102 is to be arranged is a substrate to be processed, and a silicon wafer is typically used. A layer to be processed may be formed on the substrate 101. Another layer may be further formed between the substrate 101 and the layer to be processed. In addition, when a quartz substrate is used as the substrate 101, a replica of a quartz imprint mold (quartz mold replica) can be produced.

However, the substrate 101 is not limited to the silicon wafer and the quartz substrate. The substrate 101 can be arbitrarily selected from substrates known as substrates for semiconductor devices, such as aluminum, a titanium-tungsten alloy, an aluminum-silicon alloy, an aluminum-copper-silicon alloy, silicon oxide, and silicon nitride.

The adhesiveness of the surface of the substrate 101 (substrate to be processed) to be used or of the layer to be processed with the curable composition (A) 102 may be improved by a surface treatment, such as a silane coupling treatment, a silazane treatment, or the formation of an organic thin film.

<Mold Contacting Step (2)>

Next, as illustrated in FIG. 1(2), a mold 104 having a template pattern for transferring a pattern shape is brought into contact with the curable composition (A) 102 arranged in the laying step (1). Thus, a groove portion of a fine pattern on the surface of the mold 104 is filled with the curable composition (A) 102, and hence a liquid film filled into the fine pattern of the mold 104 is obtained (enlarged portion of FIG. 1(2)).

The mold 104 that is formed of an optically transparent material is desirably used as the mold 104 considering the next light irradiating step (3). Preferred specific examples of the material for forming the mold 104 include glass, quartz, an optically transparent resin, such as PMMA or a polycarbonate resin, a transparent metal-deposited film, a flexible film made of polydimethylsiloxane or the like, a photocured film, and a metal film. In the case of using the optically transparent resin as the material for forming the mold 104, it is necessary to select a resin that does not dissolve in a component contained in the curable composition (A) 102. Quartz is particularly preferred as the material for forming the mold 104 because of its small thermal expansion coefficient and small pattern deformation.

The fine pattern on the surface of the mold 104 preferably has a pattern height of 4 nm or more and 200 nm or less. As the pattern height becomes lower, the force by which the mold 104 is peeled from the photocured film 106 of the curable composition (A) 102 in the releasing step (4) to be described later, i.e., a release force can be reduced, and the number of release defects remaining on a mask side owing to the tearing-off of the cured film 106 having a pattern shape in association with the release reduces. The cured films 106 adjacent to each other, the films having pattern shapes, are brought into contact with each other by the elastic deformation of the cured films 106 having pattern shapes due to an impact at the time of the peeling of the mold 104, and hence the cured films 106 having pattern shapes adhere to each other or are broken in some cases. However, when the pattern height is about twice or less as large as a pattern width (an aspect ratio is 2 or less), there is a high possibility that such inconveniences can be avoided. Meanwhile, when the pattern height is excessively low, the processing accuracy of the substrate to be processed is low.

The mold 104 may be subjected to a surface treatment before this step, which is a mold contacting step (2) of the curable composition (A) 102 that has been photocured and the mold 104, so as to enhance the releasability between the curable composition (A) 102 and the surface of the mold 104. As a method for the surface treatment, there is given a method involving forming a release agent layer by applying a release agent onto the surface of the mold 104. In this case, examples of the release agent to be applied onto the surface of the mold 104 include a silicon-based release agent, a fluorine-based release agent, a hydrocarbon-based release agent, a polyethylene-based release agent, a polypropylene-based release agent, a paraffin-based release agent, a montan-based release agent, and a carnauba-based release agent. For example, a commercially available application-type release agent, such as OPTOOL (trademark) DSX manufactured by Daikin Industries, Ltd., can be suitably used. The release agents may be used alone or in combination thereof. Of those, fluorine-based and hydrocarbon-based release agents are particularly preferred.

A pressure to be applied to the curable composition (A) 102 when the mold 104 and the curable composition (A) 102 are brought into contact with each other in the mold contacting step (2) as illustrated in FIG. 1(2) is not particularly limited. The pressure is desirably set to 0 MPa or more and 100 MPa or less. In addition, the pressure is preferably 0 MPa or more and 50 MPa or less, more preferably 0 MPa or more and 30 MPa or less, still more preferably 0 MPa or more and 20 MPa or less.

In the mold contacting step (2), the time period for which the mold 104 and the curable composition (A) 102 are brought into contact with each other, which is not particularly limited, is desirably set to, for example, 0.1 second or more and 600 seconds or less. In addition, the time period is preferably 0.1 second or more and 3 seconds or less, particularly preferably 0.1 second or more and 1 second or less. When the time period is shorter than 0.1 second, the following tendency is observed: the spread and the fill become insufficient, and hence many defects called non-filling defects occur.

Although the mold contacting step (2) can be performed under any condition of an air atmosphere, a reduced pressure atmosphere, and an inert gas atmosphere, the step is preferably performed under a reduced pressure atmosphere or an inert gas atmosphere in which an inert gas is used as an atmosphere-controlling gas because an influence of oxygen or moisture on a curing reaction can be prevented. Specific examples of the inert gas that can be used when this step is performed under an inert gas atmosphere include nitrogen, carbon dioxide, helium, argon, various chlorofluorocarbon gases, and mixed gases thereof. When this step is performed under a specific gas atmosphere including an air atmosphere, a preferred pressure is 0.0001 atm or more and 10 atm or less.

The mold contacting step (2) may be performed under an atmosphere containing a condensable gas (hereinafter referred to as "condensable gas atmosphere") using the condensable gas as the atmosphere-controlling gas. The term "condensable gas" as used herein refers to the following gas: when the gas in the atmosphere is filled into a groove portion of the fine pattern formed on the mold 104, and the gap between the mold and the substrate together with the curable composition (A) 102, the gas is condensed by a capillary pressure generated at the time of the filling to liquefy. The condensable gas is present as a gas in the atmosphere before the curable composition (A) 102 and the mold 104 are brought into contact with each other in the mold contacting step (2) (FIG. 1(1)).

When the mold contacting step (2) is performed under the condensable gas atmosphere, the gas filled into a groove portion of the fine pattern is liquefied by a capillary pressure generated by the curable composition (A) 102, and hence air bubbles disappear. Accordingly, a filling property becomes excellent. The condensable gas may dissolve in the curable composition (A) 102.

The boiling point of the condensable gas, which is not limited as long as the boiling point is equal to or less than the ambient temperature of the mold contacting step (2), is preferably from −10° C. to 23° C., more preferably from 10° C. to 23° C. When the boiling point falls within the range, the filling property is more excellent.

The vapor pressure of the condensable gas at the ambient temperature in the mold contacting step (2), which is not limited as long as the vapor pressure is equal to or less than a mold pressure when impression is performed in the mold contacting step (2), is preferably from 0.1 MPa to 0.4 MPa. When the vapor pressure falls within the range, the filling property is more excellent. When the vapor pressure at the ambient temperature is more than 0.4 MPa, the following tendency is observed: an air bubble disappearing effect cannot be sufficiently obtained. On the other hand, when the vapor pressure at the ambient temperature is less than 0.1 MPa, the following tendency is observed: decompression is needed and hence an apparatus becomes complicated. The ambient temperature in the mold contacting step (2), which is not particularly limited, is preferably from 20° C. to 25° C.

Specific examples of the condensable gas include fluorocarbons, such as: a chlorofluorocarbon (CFC), such as trichlorofluoromethane; a fluorocarbon (FC); a hydrochlorofluorocarbon (HCFC); a hydrofluorocarbon (HFC), such as 1,1,1,3,3-pentafluoropropane ($CHF_2CH_2CF_3$, HFC-245fa, PFP); and a hydrofluoroether (HFE), such as pentafluoroethyl methyl ether ($CF_3CF_2OCH_3$, HFE-245mc).

Of those, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from such a viewpoint that when the ambient temperature in the mold contacting step (2) is from 20° C. to 25° C., the filling property is excellent. Further, 1,1,1,3,3-pentafluoropropane is particularly preferred from the viewpoint of being excellent in safety.

The condensable gases may be used alone or as a mixture thereof. In addition, any such condensable gas may be mixed with a non-condensable gas, such as air, nitrogen, carbon dioxide, helium, or argon, before use. The non-condensable gas with which the condensable gas is mixed is preferably helium from the viewpoint of the filling property. Helium can permeate the mold 104. Accordingly, when the gases (the condensable gas and helium) in the atmosphere are filled into a groove portion of the fine pattern formed on the mold 104 in the mold contacting step (2) together with the curable composition (A), the condensable gas liquefies and helium permeates the mold 104.

<Light Irradiating Step (3)>

Next, as illustrated in FIG. 1(3), the curable composition (A) 102 is irradiated with irradiation light 105 through the mold 104. In more detail, the curable composition (A) 102 filled into the fine pattern of the mold 104 is irradiated with the irradiation light 105 through the mold 104. Thus, the curable composition (A) 102 filled into the fine pattern of the mold 104 is cured by the irradiation light 105 to become a cured film 106 having a pattern shape.

In this case, the irradiation light 105 with which the curable composition (A) 102 filled into the fine pattern of the mold 104 is irradiated is selected depending on the sensitive wavelength of the curable composition (A) 102. Specifically, it is preferred that UV light having a wavelength of 150 nm or more and 400 nm or less, an X-ray, an electron beam, or the like be appropriately selected and used.

Of those, the irradiation light 105 is particularly preferably UV light. This is because many of the compounds commercially available as curing aids (photopolymerization initiators) have sensitivity to UV light. In this case, examples of the light source of UV light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a F2 excimer laser. Of those, an ultra-high pressure mercury lamp is particularly preferred. In addition, the number of the light sources to be used may be one or two or more. In addition, the entire surface of the curable composition (A) 102 filled into the fine pattern of the mold 104 may be irradiated with light, or a part of the surface thereof may be irradiated with light.

In addition, the light irradiating step (3) may be performed on an entire region on the substrate intermittently a plurality of times, or may be continuously performed on the entire region. Further, the following may be performed: a partial region A is irradiated with the light in a first irradiating process, and a region B different from the region A is irradiated with the light in a second irradiating process.

<Releasing Step (4)>

Next, in the releasing step (4), the cured film 106 having a pattern shape and the mold 104 are released from each other. In this step, as illustrated in FIG. 1(4), the cured film 106 having a pattern shape and the mold 104 are released from each other. The cured film 106 having a pattern shape serving as the reverse pattern of the fine pattern formed on the mold 104, the film being formed in the light irradiating step (3), is obtained in an independent state. A cured film remains in a groove portion of the groove/land pattern of the cured film 106 having a pattern shape, and the film is called a residual film 107 (enlarged portion of FIG. 1(4)).

When the mold contacting step (2) is performed under the condensable gas atmosphere, the condensable gas vaporizes in association with a reduction in pressure of the interface at which the cured film 106 and the mold 104 are in contact with each other at the time of the release of the cured film 106 and the mold 104 in the releasing step (4). Thus, a reducing effect on the release force serving as a force needed for releasing the cured film 106 and the mold 104 from each other tends to be exhibited.

A method of releasing the cured film 106 having a pattern shape and the mold 104 from each other is not particularly limited as long as part of the cured film 106 having a pattern shape is not physically broken at the time of the release, and various conditions and the like are also not particularly limited. For example, the following may be performed: the substrate 101 (substrate to be processed) is fixed and the mold 104 is peeled by being moved so as to recede from the substrate 101. Alternatively, the following may be performed: the mold 104 is fixed and the substrate 101 is peeled by being moved so as to recede from the mold 104. Alternatively, both the substrate and the mold may be peeled from each other by being pulled in directions diametrically opposite to each other.

The performance of a process (production process) involving continuously performing the laying step (1) to the releasing step (4) described above on a plurality of shot areas can provide a cured film having, in each of the plurality of shot areas on the substrate, a desired groove/land pattern shape (pattern shape associated with the groove/land shape of the mold 104).

First Embodiment of Method for forming Pattern

Next, a method for forming a pattern according to a first embodiment (delayed sequence imprint (DSI)) of the present invention is described with reference to a schematic sectional view of FIG. 3. FIG. 3 is an illustration of a process corresponding to m=2 to be described later.

The method for forming a pattern according to the first embodiment (DSI) of the present invention is one mode of the photo-nanoimprint process.

The method for forming a pattern of the first embodiment (DSI) of the present invention is a method for forming a pattern including performing, on each of a plurality of shot areas on the surface of a substrate, in this order: a laying step (1) of dispensing liquid droplets of a curable composition (A) containing at least a component (a) serving as a polymerizable compound dropwise discretely to lay the liquid droplets; a mold contacting step (2) of bringing the curable composition (A) and a mold into contact with each other; a light irradiating step (3) of irradiating the curable composition (A) with light from a mold side to cure the composition; and a releasing step (4) of releasing the mold from the cured product of the curable composition (A), in which when steps from the mold contacting step (2) to the releasing step (4) are collectively called an imprinting step (Im), before the imprinting step (Im) is performed on one shot area on which the laying step (1) has already been performed out of the plurality of shot areas, the laying step (1) is performed on another shot area selected from the plurality of shot areas.

In addition, in the method for forming a pattern of the first embodiment of the present invention, after the laying step (1) has been sequentially performed on the plurality of shot areas (S(1), S(2), . . . , S(m)), where m represents an integer of 2 or more, the imprinting step (Im) on the shot area (S(1)) and the laying step (1) on a shot area (S(1+m)) are performed in the stated order, and thereafter, similarly, the imprinting step (Im) on a shot area (S(p)), where p represents an integer of 2 or more, and the laying step (1) on a shot area (S(p+m)) are performed in the stated order.

A related-art method for forming a pattern in which the laying step (1) to the releasing step (4) are sequentially performed on each of a shot area S(1) 203, a shot area S(2) 204, a shot area S(3) 205, and a shot area S(4) 206 is illustrated in FIG. 2. In the related-art method for forming a pattern, first, in the laying step (1), liquid droplets of a curable composition (A) 202 are dispensed dropwise discretely onto the shot area S(1) 203 on the substrate 201 to be arranged thereon. After that, in the imprinting step (Im) including the molding contacting step (2) to the releasing step (4), the independent cured film 209 having a pattern shape can be obtained on the substrate 201 through contact between the curable composition (A) 202 and a mold 208, and the curing of the curable composition (A) 202 by irradiation with irradiation light 207. Here, in the mold contacting step (2), spread in which the liquid droplets of the curable composition (A) 202 spread over the entire region of a gap between the substrate 201 and the mold 208 by virtue of a capillary phenomenon advances. A time required for the spread is long, and hence a filling time lengthens to reduce the throughput of the related-art method for forming a pattern. Accordingly, a waiting step [M] (not shown) for advancing the prespread of the liquid droplets of the curable composition (A) 202 can be performed after the laying step (1) and before the initiation of the mold contacting step (2). In the case where the waiting step [M] is performed, a time required for the spread of the curable composition (A) 202 after its contact with the mold 208 in the mold contacting step (2) becomes shorter than that in the case where the waiting step [M] is absent. In other words, a required time for the mold contacting step (2) is shortened. However, a total required time per one shot becomes longer by a required time for the waiting step [M]. Accordingly, the extent to which the required time for one shot is shortened is small, and hence the throughput is not largely improved, or in some cases, reduces.

In view of the foregoing, the method for forming a pattern according to the first embodiment (DSI) of the present invention is illustrated in FIG. 3. First, the laying step (1) of dispensing liquid droplets of a curable composition (A) 302 dropwise discretely onto a shot area S(1) 303 on a substrate 301 to arrange the liquid droplets thereon, and the waiting step [M] in which the prespread of the curable composition (A) 302 advances are performed in the stated order, and then the laying step (1) on a shot area S(2) 304 is performed. After that, the imprinting step (Im) on the shot area S(1) 303 and the laying step (1) on a shot area S(3) 305 are sequentially performed. In the imprinting step (Im) including the mold contacting step (2) to the releasing step (4) in the shot area S(1) 303, an independent cured film 309 having a pattern shape can be obtained on the substrate 301 through contact between the curable composition (A) 302 and a mold 308, and the curing of the curable composition (A) 302 by irradiation with irradiation light 307. Subsequently, the imprinting step (Im) on the shot area S(2) 304 and the laying step (1) on a shot area S(4) 306 are sequentially performed. Pattern formation can be performed by repeating the following: the imprinting step (Im) on a shot area S(p), where p represents an integer of 2 or more, corresponding to the order in which the laying step (1) is performed and the laying step (1) on a shot area S(p+m) are sequentially performed as described above. Although the first embodiment (DSI) of the present invention illustrated in FIG. 3 is a process corresponding to m=2, the pattern formation can be similarly performed even when m represents 3 or more.

In the first embodiment (DSI) of the present invention, as illustrated in FIG. 3, when m=2, in the shot area S(1) 303, a total time of a waiting time Tw1 in the waiting step [M] and a required time Td1 in the laying step (1) can be obtained as an interval after the completion of the laying step (1) and before the initiation of the imprinting step (Im). In addition, in the shot area S(p) on and after the shot area S(2) 304, in each shot area, a total time of a required time Ti1 in the imprinting step (Im) and the required time Td1 in the laying step (1) can be obtained as an interval. The prespread of the liquid droplets of the curable composition (A) 302 advances during the interval. Accordingly, the spread in the mold contacting step (2) is quickly completed, and hence the required time for the mold contacting step (2) can be shortened.

Here, in a period from the performance of the laying step (1) on one shot area to the performance of the laying step (1) on the next shot area, the waiting step [M] identical in length to the required time Ti1 for the performance of the imprinting step (Im) on the one shot area may be provided. In addition, in the case where the required time Tw1 for the waiting step [M] and the required time Ti1 for the imprinting step (Im) are equal to each other, and the Ti1's and the Td1's in the respective shot areas are equal to each other, the intervals in all the shots have the same length. In this case, the interval of the first embodiment of the present invention is (m−1)×(Ti1+Td1) for all the shot areas.

In addition, in the first embodiment (DSI) of the present invention, it is more preferred that the required time Td1 in the laying step (1) and the required time Ti1 in the imprinting step (Im) be equal to each other.

Second Embodiment of Method for Forming Pattern

Next, a method for forming a pattern according to a second embodiment (chasing imprint (CI)) of the present invention is described with reference to a schematic sectional view of FIG. 4. FIG. 4 is an illustration of a process corresponding to n=2 to be described later.

The method for forming a pattern according to the second embodiment (CI) of the present invention is one mode of the photo-nanoimprint process.

In the method for forming a pattern of the second embodiment of the present invention, a laying step (1) of dispensing liquid droplets of a curable composition (A) containing at least a polymerizable compound (a) dropwise discretely to lay the liquid droplets, a mold contacting step (2) of bringing the curable composition (A) and a mold into contact with each other, a light irradiating step (3) of irradiating the curable composition (A) with light from a mold side to cure the composition, and a releasing step (4) of releasing the mold from the cured product of the curable composition (A) are performed in the stated order on each of a plurality of shot areas on the surface of a substrate, and when steps from the mold contacting step (2) to the releasing step (4) are collectively called an imprinting step (Im), the laying step (1) on one shot area selected from the plurality of shot areas and the imprinting step (Im) on another shot area on which the laying step (1) has already been performed out of the plurality of shot areas are simultaneously initiated, and are simultaneously ended.

In addition, in the method for forming a pattern of the second embodiment of the present invention, after the laying step (1) has been sequentially performed on a first plurality of shot areas (S(1), S(2), ..., S(n)), where n represents an integer of 2 or more, selected from the plurality of shot areas, the laying step (1) on a second plurality of shot areas (S(n+1), S(n+2), ..., S(2n)) selected from the plurality of shot areas, the second plurality of shot areas being identical in number to the first plurality of shot areas, and the imprinting step (Im) on the first plurality of shot areas (S(1), S(2), ..., S(n)) may be sequentially performed in a concurrent manner.

In view of the foregoing, the method for forming a pattern according to the second embodiment (CI) of the present invention is illustrated in FIG. 4. First, the laying step (1) of dispensing liquid droplets of a curable composition (A) 402 dropwise discretely onto a shot area S(1) 403 on a substrate 401 to arrange the liquid droplets thereon, and the laying step (1) of dispensing liquid droplets of the curable composition (A) 402 dropwise discretely onto a shot area S(2) 404 to arrange the liquid droplets thereon are performed in the stated order, and then the imprinting step (Im) on the shot area S(1) 403 and the laying step (1) on a shot area S(3) 405 are simultaneously performed. In the imprinting step (Im) including the mold contacting step (2) to the releasing step (4) in the shot area S(1) 403, an independent cured film 409 having a pattern shape can be obtained on the substrate 401 through contact between the curable composition (A) 402 and a mold 408, and the curing of the curable composition (A) 402 by irradiation with irradiation light 407. Subsequently, the imprinting step (Im) on the shot area S(2) 404 and the laying step (1) on a shot area S(4) 406 are simultaneously performed. Thereafter, similarly, the imprinting step (Im) on a shot area S(q), where q represents an integer of 2 or more, and the laying step (1) on a shot area S(q+n) are sequentially performed in a concurrent manner. Although the second embodiment (CI) of the present invention illustrated in FIG. 4 is a process corresponding to n=2, even a process in which n represents 3 or more can be similarly performed.

In the second embodiment (CI) of the present invention, as illustrated in FIG. 4, when n=2, in each shot area, a Td2 serving as a required time in the laying step (1) and as a required time in the imprinting step (Im) can be obtained as an interval after the completion of the laying step (1) and before the initiation of the imprinting step (Im). The pre-spread of the liquid droplets of the curable composition (A) 402 advances during the interval, and hence spread during the performance of the mold contacting step (2) is quickly completed. Accordingly, a required time for the mold contacting step (2) can be shortened. When the Td2's in the respective shot areas are equal to each other, the interval of the second embodiment (CI) of the present invention is (n−1)×Td2 for all the shot areas.

In addition, in the second embodiment (CI) of the present invention, in an apparatus including two or more substrate-mounting stages, one dispenser, and one imprint head, the apparatus being capable of performing the laying step (1) and the imprinting step (Im) on two or more substrates, the following may be performed: the laying step (1) on one shot area on a first substrate and the imprinting step (Im) on one shot area on a second substrate are simultaneously initiated, and are simultaneously ended.

EXAMPLES

Examples 1 to 5 and Comparative Examples 1 to 3

A required time for the performance of pattern formation by the photo-nanoimprint process on 100 shot areas is shown in Table 1.

In each of Examples 1 to 3, the first embodiment (DSI) of the present invention is performed. In each of Examples 4 and 5, the second embodiment (CI) of the present invention is performed. In each of Comparative Examples 1 to 3, the related-art pattern formation in which the laying step (1) to the releasing step (4) are sequentially performed for each shot area is performed.

As described in the foregoing, as an interval becomes longer, a filling time in the mold contacting step (2) becomes shorter and hence a required time for the imprinting step (Im) becomes shorter. The pattern formation by the photo-nanoimprint process is performed on 100 shot areas as follows: as shown in Table 1, in each of Examples 1 to 3, the required time Td1 in the laying step (1), the waiting time Tw1, and the required time Ti1 in the imprinting step (Im) are set, in each of Examples 4 and 5, the Td2 serving as a required time in the laying step (1) and as a required time in the imprinting step (Im) is set, and in each of Comparative Examples 1 to 3, a required time Td in the laying step (1), a waiting time Tw, and a required time Ti in the imprinting step (Im) are set.

TABLE 1

|  | Example 1 | Example 2 | Example 3 |
|---|---|---|---|
| Sequence | DSI | DSI | DSI |
| m | 2 | 3 | 3 |
| Td1 | 0.5 second | 1.0 second | 0.5 second |
| Tw1 | 1.5 seconds | 1.0 second | 1.0 second |
| Ti1 | 1.5 seconds | 1.0 second | 1.0 second |
| Interval | 2.0 seconds | 4.0 seconds | 3.0 seconds |
| Required time | 202 seconds | 204 seconds | 151.5 seconds |
| Filling property | Satisfactory | Satisfactory | Satisfactory |

|  | Example 4 | Example 5 |
|---|---|---|
| Sequence | CI | CI |
| m | 2 | 4 |
| Td2 | 1.5 seconds | 1.0 second |
| Interval | 1.5 seconds | 3.0 seconds |
| Required time | 153 seconds | 103 seconds |
| Filling property | Satisfactory | Satisfactory |

TABLE 1-continued

|  | Comparative Example 1 | Comparative Example 2 | Comparative Example 3 |
|---|---|---|---|
| Sequence | Related-art method | Related-art method | Related-art method |
| Td | 0.5 second | 0.5 second | 0.5 second |
| Tw | 0 seconds | 0 seconds | 1.5 seconds |
| Ti | 2.0 seconds | 1.5 seconds | 1.5 seconds |
| Interval | 0 seconds | 0 seconds | 1.5 seconds |
| Required time | 250 seconds | 200 seconds | 350 seconds |
| Filling property | Satisfactory | Unsatisfactory | Satisfactory |

It is shown from Examples 1 to 3 that in the first embodiment (DSI) of the present invention, a required time of from 151.5 seconds to 204 seconds suffices for the performance of the pattern formation on 100 shot areas without the occurrence of any filling failure.

It is shown from Examples 4 and 5 that in the second embodiment (CI) of the present invention, a required time of from 103 seconds to 153 seconds suffices for the performance of the pattern formation on 100 shot areas without the occurrence of any filling failure.

It is shown from Comparative Examples 1 to 3 that in the related-art method for forming a pattern, a required time of 250 seconds is needed for the performance of the pattern formation on 100 shot areas without the occurrence of any filling failure.

As described above, it is shown that, through use of the method of this embodiment, a photo-nanoimprint technology having a short filling time and high throughput can be provided.

According to the present invention, the photo-nanoimprint technology having a short filling time and high throughput can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method for forming a pattern by using a photo-nanoimprint process, comprising performing, on each of a plurality of shot areas on a surface of a substrate, in this order:
    a laying step (1) of dispensing liquid droplets of a curable composition (A) containing at least a component (a) serving as a polymerizable compound dropwise discretely to lay the liquid droplets;
    a mold contacting step (2) of bringing the curable composition (A) and a mold into contact with each other;
    a light irradiating step (3) of irradiating the curable composition (A) with light from a mold side to cure the composition; and
    a releasing step (4) of releasing the mold from a cured product of the curable composition (A),
    wherein when steps from the mold contacting step (2) to the releasing step (4) are collectively called an imprinting step (Im), before the imprinting step (Im) is performed on one shot area on which the laying step (1) has already been performed out of the plurality of shot areas, the laying step (1) is performed on another shot area selected from the plurality of shot areas,
    wherein after the laying step (1) has been sequentially performed on the plurality of shot areas (S(1), S(2), . . . , S(m)), where m represents an integer of 2 or more, the imprinting step (Im) on the shot area (S(1)) and the laying step (1) on a shot area (S(1+m)) are performed in the stated order, and thereafter, the imprinting step (Im) on a shot area (S(p)), where p represents an integer of 2 or more, and the laying step (1) on a shot area (S(p+m)) are performed in the stated order, and
    wherein when the laying step (1) is sequentially performed on the plurality of shot areas (S(1), S(2), . . . , S(m)), in a period from performance of the laying step (1) on one shot area to performance of the laying step (1) on a next shot area, a waiting step [M] identical in length to a required time Ti1 for performance of the imprinting step (Im) on the one shot area is provided.

2. The method according to claim 1, wherein when a required time in the laying step (1) is represented by Td1, in one arbitrary shot area, a required time for initiation of the imprinting step (Im) after completion of the laying step (1) is $(m-1) \times (Ti1+Td1)$.

3. The method according to claim 2, wherein the required time Td1 in the laying step (1) and the required time Ti1 in the imprinting step (Im) are equal to each other.

4. The method according to claim 1, wherein the curable composition (A) has a volume reduction ratio of 10% in a period after the liquid droplets have been dispensed dropwise discretely to be laid in the laying step (1) and before the mold is brought into contact with the curable composition (A) in the mold contacting step (2).

5. The method according to claim 1, wherein the curable composition (A) has a weight reduction ratio of a composition of components of the curable composition (A), except a component (d) serving as a solvent, of 10% or less 10 seconds after the liquid droplets have been dispensed dropwise discretely to be laid in the laying step (1).

6. The method according to claim 1, wherein the curable composition (A) has a vapor pressure of a composition of components of the curable composition (A), except a component (d) serving as a solvent, at 20° C. of 0.5 kPa or less.

* * * * *